(12) United States Patent  (10) Patent No.: US 8,151,133 B2
Kizer et al.  (45) Date of Patent: Apr. 3, 2012

(54) METHOD FOR CALIBRATING READ OPERATIONS IN A MEMORY SYSTEM

(75) Inventors: Jade M. Kizer, Durham, NC (US); Sivakumar Doraiswamy, San Jose, CA (US); Benedict Lau, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 346 days.

(21) Appl. No.: 12/477,092

(22) Filed: Jun. 2, 2009

(65) Prior Publication Data

US 2009/0240968 A1  Sep. 24, 2009

Related U.S. Application Data

(63) Continuation of application No. 11/019,432, filed on Dec. 21, 2004, now Pat. No. 7,543,172.

(51) Int. Cl.
*G06F 1/12*  (2006.01)

(52) U.S. Cl. ............... 713/401; 713/503; 713/600

(58) Field of Classification Search .......... 713/401
See application file for complete search history.

(56) References Cited

U.S. PATENT DOCUMENTS

| | | | |
|---|---|---|---|
| 4,410,916 A | 10/1983 | Pratt et al. | 382/181 |
| 4,687,954 A | 8/1987 | Yasuda et al. | 327/206 |
| 4,926,447 A | 5/1990 | Corsetto et al. | 375/120 |
| 5,060,239 A | 10/1991 | Briscoe et al. | 375/38 |
| 5,334,883 A | 8/1994 | Rosenthal | 327/206 |
| 5,341,371 A | 8/1994 | Simpson | 370/85.4 |
| 5,655,105 A | 8/1997 | McLaury | 711/169 |
| 5,805,619 A | 9/1998 | Gardner et al. | 371/61 |
| 5,832,303 A | 11/1998 | Murase | 710/36 |
| 5,935,257 A | 8/1999 | Nishimura | 713/503 |
| 5,948,083 A * | 9/1999 | Gervasi | 710/62 |
| 5,978,281 A | 11/1999 | Anand et al. | 365/189.05 |
| 6,023,174 A | 2/2000 | Kirsch | 326/34 |
| 6,028,816 A | 2/2000 | Takemae et al. | 365/233 |
| 6,055,587 A | 4/2000 | Asami et al. | 710/49 |
| 6,279,073 B1 | 8/2001 | McCracken et al. | 711/105 |
| 6,316,980 B1 | 11/2001 | Vogt et al. | 327/273 |

(Continued)

FOREIGN PATENT DOCUMENTS

DE  19920335  9/2000

(Continued)

OTHER PUBLICATIONS

Collins, Hansel A. and Nikel, Ronald E., "DDR-SDRAM, high-speed, source-synchronous interfaces create design challenges", EDN, Sep. 2, 1999, pp. 63, 64, 66, 68, 70, 72, available at http://www.ednmag/reg/1999/090299/18ms544.htm.

(Continued)

*Primary Examiner* — Nitin Patel
(74) *Attorney, Agent, or Firm* — Mahamedi Paradice Kreisman LLP; Lance M. Kreisman

(57) ABSTRACT

A method of calibrating read operations in a memory system is disclosed. The method involves placing a memory controller in a calibration mode, and performing a series of dummy read operations. Each of the read operations performs a read of pre-specified data stored in at least one memory component while using different ones of delayed enable signals. Data read from respective dummy read operations is compared to identify successful read operations while the timing information from successful read operations is compared to identify a suitable delayed enable signal.

21 Claims, 7 Drawing Sheets

U.S. PATENT DOCUMENTS

| | | | | |
|---|---|---|---|---|
| 6,396,887 | B1 | 5/2002 | Ware | 365/354 |
| 6,466,491 | B2 | 10/2002 | Yanagawa | 365/194 |
| 6,498,766 | B2 | 12/2002 | Lee et al. | 365/233 |
| 6,512,704 | B1 | 1/2003 | Wu et al. | 365/189.07 |
| 6,570,800 | B2 | 5/2003 | Tanaka | 365/219 |
| 6,570,944 | B2 | 5/2003 | Best | 375/355 |
| 6,643,787 | B1 | 11/2003 | Zerbe | 713/400 |
| 6,646,929 | B1 | 11/2003 | Moss et al. | 365/194 |
| 6,646,953 | B1 | 11/2003 | Stark | 365/233 |
| 6,675,272 | B2 | 1/2004 | Ware | 711/167 |
| 6,691,214 | B1 | 2/2004 | Li et al. | 711/167 |
| 6,707,723 | B2 | 3/2004 | Jeong | 365/189.05 |
| 6,735,709 | B1 * | 5/2004 | Lee et al. | 713/401 |
| 6,759,881 | B2 | 7/2004 | Kizer | 327/147 |
| 6,782,459 | B1 | 8/2004 | Ware | 711/167 |
| 6,819,157 | B2 | 11/2004 | Cao et al. | 327/262 |
| 6,836,503 | B2 | 12/2004 | Best | 375/35 |
| 6,836,521 | B2 | 12/2004 | Ware | 375/354 |
| 6,889,334 | B1 * | 5/2005 | Magro et al. | 713/500 |
| 6,898,682 | B2 * | 5/2005 | Welker et al. | 711/163 |
| 6,930,932 | B2 | 8/2005 | Rentschler | 365/193 |
| 6,940,760 | B2 | 9/2005 | Borkenhagen et al. | 365/189.05 |
| 6,940,768 | B2 | 9/2005 | Dahlberg et al. | 365/201 |
| 6,941,433 | B1 * | 9/2005 | Libby et al. | 711/167 |
| 7,031,205 | B2 | 4/2006 | Han et al. | 365/193 |
| 7,107,424 | B1 * | 9/2006 | Avakian et al. | 711/167 |
| 7,259,606 | B2 * | 8/2007 | Ku et al. | 327/235 |
| 2001/0020278 | A1 | 9/2001 | Saito | 713/400 |
| 2002/0009004 | A1 | 1/2002 | Hamada et al. | 365/201 |
| 2002/0021616 | A1 | 2/2002 | Keeth et al. | 365/233 |
| 2002/0149397 | A1 | 10/2002 | Dally et al. | 327/51 |
| 2002/0196883 | A1 | 12/2002 | Best et al. | 375/355 |
| 2003/0065465 | A1 | 4/2003 | Johnson et al. | 702/89 |
| 2003/0081707 | A1 | 5/2003 | Takeuchi et al. | 375/354 |
| 2003/0091136 | A1 | 5/2003 | Sugita | 375/355 |
| 2003/0179611 | A1 | 9/2003 | Liou | 365/193 |
| 2003/0218504 | A1 | 11/2003 | Nguyen et al. | 330/279 |
| 2003/0221050 | A1 | 11/2003 | Hong | 711/105 |
| 2004/0044919 | A1 | 3/2004 | Dabral | 713/400 |
| 2004/0068682 | A1 | 4/2004 | Takei et al. | 714/700 |
| 2004/0084537 | A1 | 5/2004 | Best | 235/492 |
| 2004/0213067 | A1 | 10/2004 | Best | 365/222 |
| 2004/0230715 | A1 | 11/2004 | Huang | 710/15 |
| 2005/0005056 | A1 | 1/2005 | Ware | 711/1 |
| 2005/0071707 | A1 | 3/2005 | Hampel | 713/600 |
| 2005/0110544 | A1 | 5/2005 | Suda et al. | 327/165 |
| 2005/0141294 | A1 | 6/2005 | Bonelli | 365/193 |
| 2005/0163203 | A1 | 7/2005 | Ware | 375/219 |

FOREIGN PATENT DOCUMENTS

| | | |
|---|---|---|
| WO | 98/44674 A1 | 10/1998 |
| WO | 9917183 | 4/1999 |

OTHER PUBLICATIONS

IBM Corporation, "PowerPC Embedded Processors PowerPC 440GP-DDR SDRAM Controller Initialization," Mar. 20, 2002, pp. 1-7.

"DDR-SDRAM-4: DLL Circuit Technology," Find, Nov. 1998, pp. 1-4, vol. 16, No. 4. (4 pages).

Ryan, Kevin, "DDR SDRAM Functionality and Controller Read Data Capture," Micron Technology, Inc. DesignLine, 1999, pp. 1-24, vol. 8, Issue 3. (24 pages).

Ajanta Chakraborty: "Efficient Self-Timed Interfaces for Crossing Clock Domains," thesis submitted to the Department of Computer Science, University of British Columbia (Bhopal Engineering College), Aug. 2003, 74 pgs.

Horowitz, Hill: "The Art of Electronics" (second edition), 1989, Cambridge, p. 231-232.

"DDR-SDRAM-2: Detailed Specifications," Find, Nov. 1998, pp. 1-14, vol. 16, No. 4. (14 pages).

International Search Report and Written Opinion of the International Searching Authority in International Application PCT/US2006/008610, World Intellectual Property Organization, EPO, Jul. 7, 2006, 12 pgs.

Jens Muttersbach, Thomas Villiger, Worfgang Fichtner: "Practical Design of Globally-Asynchronous Locally-Synchronous Systems," Sixth International Symposium on Advanced Research in Asynchronous Circuits and Systems (ASYNC 2000), 8 pgs, Apr. 2000.

International Search Report and Written Opinion of the International Searching Authority in International Application PCT/US2005/028709, World Intellectual Property Organization, Jan. 19, 2006, 19 pages.

Altera, "Using Source-Synchronous Signaling with DPA in Stratix GX Devices," Application Note 236, pp. 1-18, Altera Corporation, Jan. 2003, available at http://www.altera.com/literature/an/an236.pdf.

Xilinx, "Using the XC9500 Timing Model," Application Note XAPP071, pp. 2-9 to 2-12, Xilinx Corporation, Jan. 1997, available at http://direct.xilinx.com/bvdocs/appnotes/xapp071.pdf. (4 pages).

Khatib, Jamil, "FIFO, First-In-First Out Memory," pp. 1-6, Mar. 28, 1999, available at http://www.geocities.com/Silicon Valley/Pines/6639/ip/fifo.html.

"SN74ALVC7804 512x8 First-In, First-Out Memory," SCAS432, pp. 1-10 & Addendum pp. 1-3, Texas Instruments Corporation, Jan. 1995, available at http://focus.ti.com/lit/ds/symlink/sn74alvc7804.pdf (13 pages).

Rajpal, Suneel, et al., "Designing with FIFOs," Technical Note TN-06, pp. 1-2, Integrated Device Technology Corporation, Nov. 1997, available at.

"CMOS Parallel-to-Serial FIFO 256x16, 512x16, 1024x16," pp. 1-10, Integrated Device Technology Corporation, Dec. 1999, available at http://www.digchip.com/datasheets/parts/datasheet/222/IDT72105.php.

"Tech Brief 31: Using Delay Lines to Generate Multi-Phased Clocks," p. 1, Dallas Semiconductor Corporation, Dec. 12, 2001, available at http://www.maximic.com/appnotes.cfm/appnote_number/880 (2 pages).

Schumann, T. and Klar, H., "An Asynchronous up/down Counter for Control of a Self-timed, Wave-pipelined Array Multiplier," Abstract, ACiD-WL Workshop, Groningen, the Netherlands, Sep. 1996, available at http://mikro.ee.tuberlin.de/forschung/sgemos/abstractACiD.ps.gz. (1 pages).

International Preliminary Report on Patentability and Written Opinion of the International Searching Authority in International Application PCT/US2005/028709, European Patent Office, Mar. 1, 2007. (13 pages).

International Search Report and Written Opinion of the International Searching Authority in International Application PCT/US2007/063780, European Patent Office, Dec. 5, 2007. (14 pages).

Response dated Jun. 18, 2010 to Office Action re Notice to File missing Parts and Preliminary Amendment re U.S. Appl. No. 12/721,520. 7 Pages.

Office Action with mail date of Oct. 15, 2010 re U.S. Appl. No. 12/694,251 includes Notice of References cited. 13 Pages.

Information Disclosure Statement dated Nov. 18, 2010 re U.S. Appl. No. 12/721,520. 4 Pages.

Response dated Feb. 15, 2011 to the Non-Final Office Action mailed Oct. 15, 2010 U.S. Appl. No. 12/694,251. 17 Pages.

Office Action with mail date of Mar. 3, 2011 re U.S. Appl. No. 12/721,520 includes Notice of References Cited and Information Disclosure Statement. 10 Pages.

Information Disclosure Statement with mail date of Apr. 1, 2011 re U.S. Appl. No. 12/694,251. 6 Pages.

Final Office Action dated Apr. 29, 2011 re U.S. Appl. No. 12/694,251 includes Notice of References Cited and Information Disclosure Statement. 12 Pages.

Response dated Jun. 3, 2011 to the Office Action mailed Mar. 3, 2011 re U.S. Appl. No. 12/721,520. 11 Pages.

Response dated Jun. 22, 2011 to the Final Office Action mailed Apr. 29, 2011 re U.S. Appl. No. 12/694,251. 8 Pages.

Notice of Allowance and Fee(s) Due dated Jul. 8, 2011 re U.S. Appl. No. 12/694,251 includes Notice of References Cited. 17 Pages.

Office Action dated Aug. 9, 2011 re U.S. Appl. No. 12/721,520 includes Notice of References Cited. 8 Pages.

* cited by examiner

METHOD FOR CALIBRATING READ OPERATIONS IN A MEMORY SYSTEM

CROSS-REFERENCE TO RELATED APPLICATIONS

This application is a continuation of U.S. patent application Ser. No. 11/019,432, filed Dec. 21, 2004 now U.S. Pat. No. 7,543,172, entitled STROBE MASKING IN A SIGNALING SYSTEM HAVING MULTIPLE CLOCK DOMAINS, now U.S. Pat. No. 7,543,172, issued Jun. 2, 2009, which is hereby incorporated by reference in its entirety.

TECHNICAL FIELD

The disclosure herein relates generally to strobe-based information transfer systems, methods, and/or integrated circuits ("ICs") that use strobe-based data capture.

BACKGROUND

High-speed processor-based electronic systems include numerous components or subsystems some or all of which are running at different phases of a particular clock frequency (e.g., different clock domains). The communications between two components running in different clock domains is complicated by the fact that the communication of information must occur across the different clock domains, referred to as a clock domain crossing ("CDC"). As an example, a memory component of an electronic system may be running in a first clock domain while a memory controller with which the memory component exchanges information is running in a second clock domain. Transferring data between the memory controller and the memory device typically involves a CDC between the first and second clock domains.

As a result of the different clock domains of the components of the system, communications of data or other information between two components may also include a signal that indicates when the information is valid. Returning to the example above the valid signal, referred to as a strobe signal, is a timing signal that is aligned to and accompanies a data signal transmitted by the memory component (first clock domain) to the memory controller (second clock domain). The strobe signal is used by the memory controller in controlling receipt of data of the data signal.

Receipt or sampling of data under control of a strobe signal involves use of the strobe signal to generate sample clock signals that control sampling instants of a receiver associated with a data line or pin of the memory component. It often becomes necessary to gate the strobe signal so that it is only active during "read" operations when data is being received from the memory device using timing information provided by the strobe signal.

Figure 1:
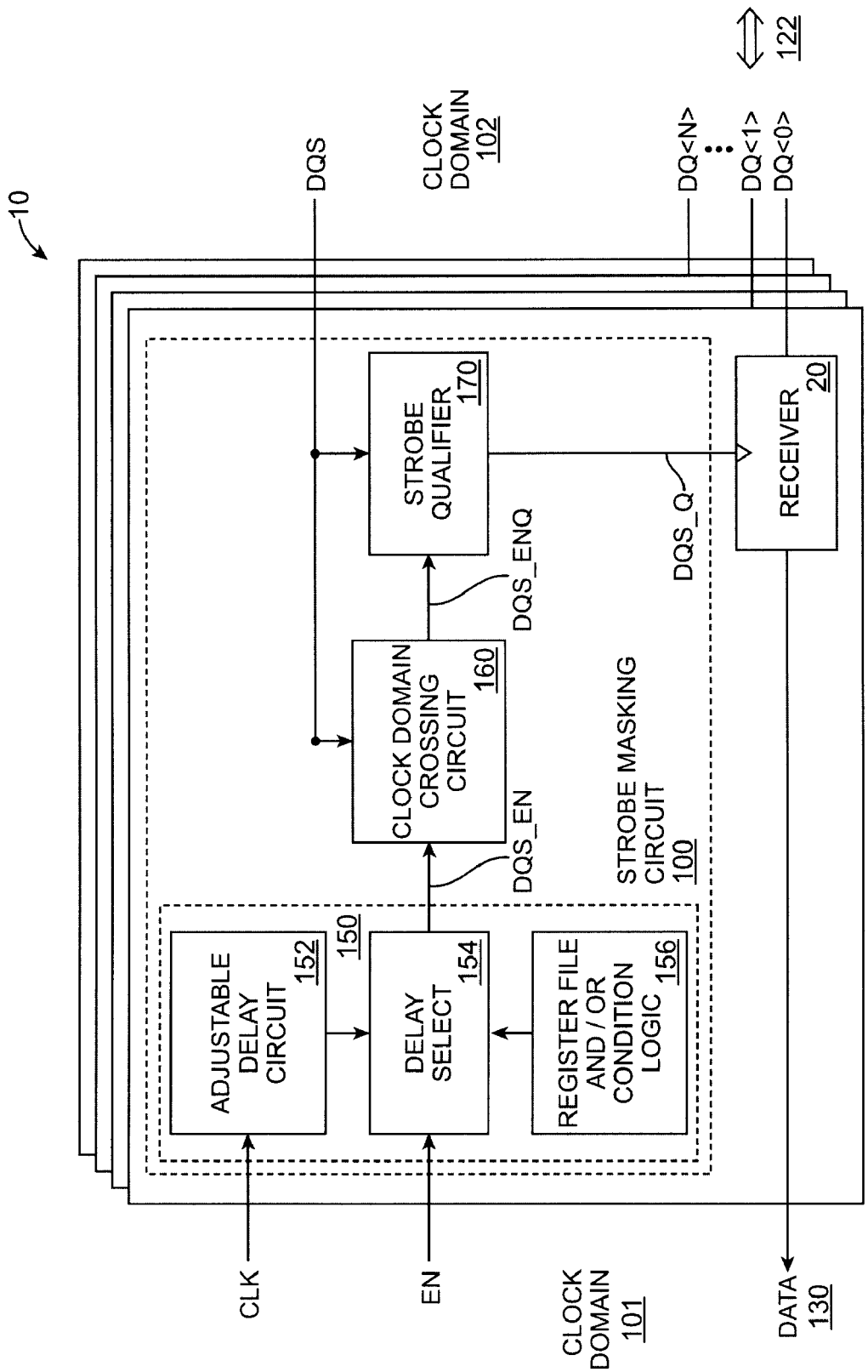
FIG. 1 is a block diagram of a system including a strobe-masking system or circuit for generating masked strobe signals, under an embodiment.

In the drawings, the same reference numbers identify identical or substantially similar elements or acts. To easily identify the discussion of any particular element or act, the most significant digit or digits in a reference number refer to the Figure number in which that element is first introduced (e.g., element 160 is first introduced and discussed with respect to FIG. 1).

DETAILED DESCRIPTION

Systems, methods, and/or integrated circuits that use strobe-based data capture for masking strobe signals in strobe-based systems are provided below. These systems and methods, also referred to herein as strobe-masking systems and methods, receive a strobe signal (also referred to as "DQS", "sample signal", and "data strobe") from a component operating under one clock domain and in turn generate a masked version of the strobe signal. The masked version of the strobe signal is referred to herein as a "masked strobe signal". Components, such as integrated circuit devices of a system in which the strobe-masking system is hosted or to which the strobe-masking system couples use the masked strobe signal to receive or transfer data from the clock domain of the strobe signal through a mesochronous clock domain into a different clock domain. The data for transfer is received on a pin or data line that originates at one or more components operating in the same clock domain as the strobe signal. The masked strobe signal eliminates glitches from the strobe due to multi-driver bus handoffs that can corrupt downstream data and following mesochronous CDC.

The strobe-masking system generates the masked strobe signal using information of the strobe signal along with information of an enable signal, where the enable signal and strobe signal originate in different clock domains. The enable signal identifies or corresponds to transitions of the strobe signal that indicate the presence of valid data on a corresponding data signal or line, where the data signal corresponds to the strobe signal. The strobe-masking system controls and applies a delay to the enable signal as appropriate to timing differences between the different clock domains, and generates the masked strobe signal using information of both the delayed enable signal and the strobe signal. The masked strobe signal couples to, for example, a receiver or other input sampler to control transfer of data (of the data line) between the clock domains.

The strobe-masking system is for use in strobe-based systems that include strobe-based memory systems and memory devices, for example. The strobe-based memory systems may include double data rate synchronous dynamic random access memory devices (DDR SDRAM) as well as further generations, such as DDR2 SDRAM and other DDR SDRAM variants, such as reduced latency DRAM (RLDRAM), RLDRAM2, Graphics DDR (GDDR) and GDDR2, GDDR3, to name a few, but are not limited to memory devices and systems incorporating these memory devices.

In the following description, numerous specific details are introduced to provide a thorough understanding of, and enabling description for, embodiments of the strobe-masking system. One skilled in the relevant art, however, will recognize that these embodiments can be practiced without one or more of the specific details, or with other components, systems, etc. In other instances, well-known structures or operations are not shown, or are not described in detail, to avoid obscuring aspects of the disclosed embodiments. As an example, the strobe-masking system embodiments described herein are presented in the context of transferring individual data bits DQ<X> (where DQ<X> represents any one of a number of data lines DQ<N:0>, where X is any of data lines 0, 1, 2 ... N) using corresponding strobe signals DQS with the understanding that the disclosed concepts apply to all data transfers between different clock domains.

FIG. 1 is a block diagram of a system 10 including a strobe-masking system or circuit 100 for generating masked strobe signals (also referred to herein as "DQS_Q"), under an embodiment. The strobe-masking system 100 is a component of and/or coupled to one or more systems or devices (not shown) as appropriate to the host system/device 10. The strobe-masking system 100 couples to receive a clock signal CLK and an enable signal EN from one or more components (not shown) operating under a first clock frequency or domain 101. The strobe-masking system 100 also couples to a strobe signal DQS operating under a second clock frequency or domain 102. The information of the strobe signal DQS corresponds to information of one or more data signals DQ<X> of individual data pins or lines originating from one or more components (not shown) in the second clock domain 102.

The strobe-masking system 100 generates a masked strobe signal DQS_Q in the CDC using information of the strobe signal DQS along with information of the enable signal EN, where the enable signal EN identifies or corresponds to transitions of the strobe signal DQS that indicate the presence of valid data on the corresponding data signal DQ<X>. The strobe-masking system 100 applies a delay to the enable signal EN as appropriate to timing differences between the different clock domains 101 and 102, and generates the masked strobe signal DQS_Q using information of both the delayed enable signal DQS_EN and the strobe signal DQS.

The system 10 of an embodiment couples the masked strobe signal DQS_Q of the CDC to a receiver 20 for example to control transfer of data of the data signal DQ<X> between the clock domains 101 and 102. The receiver 20 couples to receive a data signal DQ<X> via lines 122. The data signal DQ<X> includes information of one data bit of an N-bit wide data byte transferred to the receiver 20 from one or more devices (not shown) operating in the second clock domain 102 via signal lines or buses 122, for example. The receiver 20 samples the data signal DQ<X> in response to the masked strobe signal DQS_Q as described below and outputs data signal 130 (includes data <0:N>) to one or more component in the first clock domain 101. While the strobe-masking system 100 of an embodiment couples the masked strobe signal DQS_Q to a receiver 20 of one data bit of an N-bit wide data byte, the strobe-masking system of various alternative embodiments may couple the masked strobe signal DQS_Q to any number and/or combination of receivers and/or buffers (not shown), for example.

The strobe-masking system 100 of an embodiment includes a clock domain crossing ("CDC") circuit 160 coupled to a delay circuit 150 and a strobe qualifier circuit 170. The delay circuit 150 couples to receive the clock signal CLK and enable signal EN. The clock signal CLK and enable signal EN are received from one or more components (not shown) operating under the first clock frequency or domain 101. The delay circuit 150 adjusts the phase relationship between the enable signal EN and strobe signal DQS by controlling and applying a delay to the enable signal EN in order to generate a delayed version of the enable signal. The delayed version of the enable signal is also referred to herein as the "delayed enable signal" or "DQS_EN". The delay value is controlled, for example, to optimally align the delayed enable signal DQS_EN with a valid segment of the corresponding strobe signal DQS, as described below, but is not so limited. The optimal alignment can be with respect to the rising edge or falling edge transitions of the signals.

The delay circuit 150 may include any number of circuits that generate and/or apply a delay or offset to a received signal (e.g., EN) in order to produce a delayed version of the received signal. As an example, the delay circuit 150 of an embodiment includes one or more of an adjustable delay circuit or element 152, a delay select circuit 154, and a register file or condition circuit 156. The adjustable delay circuit 152 includes one or more delay elements that couple to receive the clock signal CLK and are slaved to a compensated locked loop structure like a delay-locked loop ("DLL"), for example. Under control of information of the condition circuit or register file 156, the delay select circuit 154 controls or adjusts a delay period and generates the delayed enable signal DQS_EN by applying the delay to the enable signal EN. The delay circuit 150 of an embodiment supports delays or delay periods as appropriate to the host system 10 and/or delay parameters of one or more components of the strobe masking system 100.

The strobe-masking system 100 couples the delayed enable signal DQS_EN to the CDC circuit 160. The CDC circuit 160 also couples to the strobe signal DQS. The CDC circuit 160 latches the delayed enable signal DQS_EN into the clock domain of the strobe signal DQS in response to a valid segment of the strobe signal DQS and in so doing generates a version of the enable signal that is synchronized to a valid region or portion of the strobe signal DQS. This version of the enable signal that is synchronized to the strobe signal is referred to herein as the "synchronized enable signal" or "DQS_ENQ".

The strobe-masking system 100 couples the synchronized enable signal DQS_ENQ to the strobe qualifier circuit 170. Like the CDC circuit 160, the strobe qualifier circuit 170 also couples to the strobe signal DQS. The strobe qualifier circuit 170 generates a masked strobe signal by gating the strobe signal DQS using the synchronized enable signal DQS_ENQ. The masked strobe signal, also referred to herein as the "qualified strobe signal" or "DQS_Q", is output for use in performing data transfers between components operating in two different clock domains, where one clock domain is that of the enable signal EN and the other clock domain is that of the strobe signal DQS.

Figure 2:
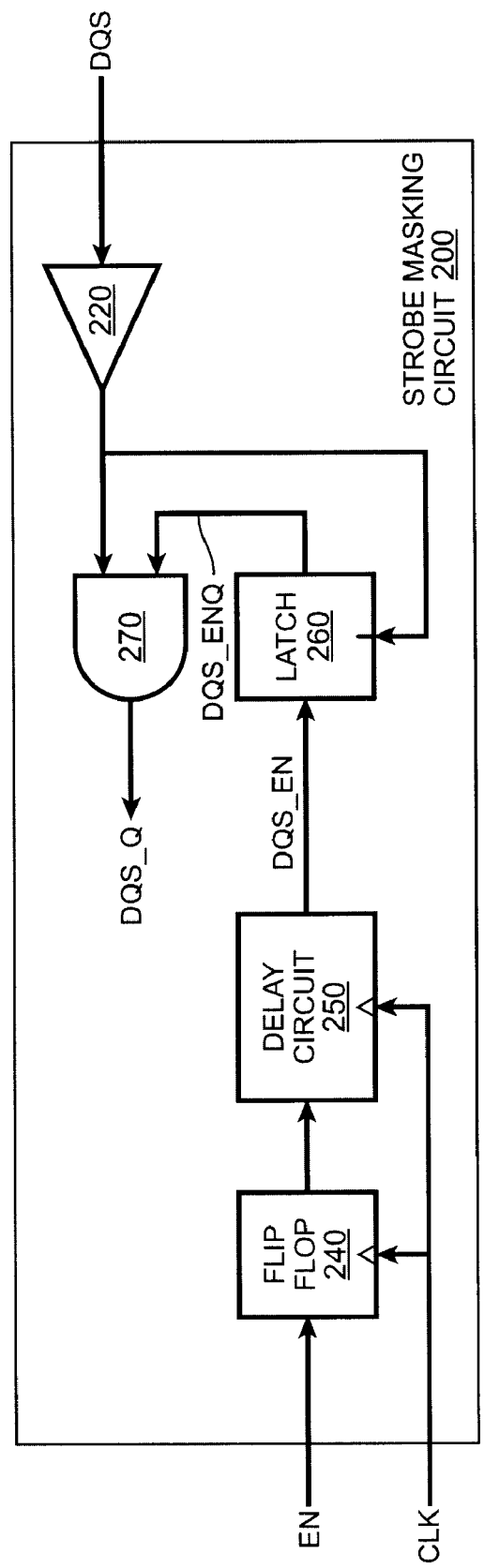
FIG. 2 is a block diagram of a strobe-masking circuit for generating masked strobe signals, under an embodiment.

FIG. 2 is a block diagram of a strobe-masking circuit 200 for generating masked strobe signals, under an embodiment. The strobe-masking circuit 200 includes a flip-flop 240 that couples to receive a clock signal CLK and an enable signal EN, both of which operate at a first clock frequency. The flip-flop couples the enable signal EN to a delay circuit 250 under control of the clock signal CLK. The delay circuit 250, in addition to receiving the enable signal EN, couples to receive the clock signal CLK. Components of the delay circuit 250 generate and/or apply a delay to the enable signal EN in order to generate a delayed enable signal DQS_EN, as described above.

The strobe-masking circuit 200 couples the delayed enable signal DQS_EN to a latch circuit 260, also referred to as the CDC circuit. The latch circuit 260 also couples to receive the strobe signal DQS, where the strobe signal DQS originates in a different clock or frequency domain from that of the clock signal CLK and enable signal EN. Components of the strobe-masking circuit 200 couple to the strobe signal DQS via a signal conditioner 220 like an amplifier for example, but are not so limited. In response to an edge transition of the strobe signal DQS, indicating the start of a valid region of the strobe signal DQS, the latch circuit 260 latches the delayed enable signal DQS_EN into the clock domain of the strobe signal DQS. The latch circuit 260 outputs the synchronized enable signal DQS_ENQ synchronized to a valid region or portion of the strobe signal DQS.

The strobe-masking circuit 200 couples the synchronized enable signal DQS_ENQ to a first input of an AND gate 270, also referred to as the strobe qualifier circuit 270. The strobe signal DQS couples to a second input of the AND gate 270. The AND gate 270 outputs a masked or qualified strobe signal DQS_Q by gating the strobe signal DQS using the synchronized enable signal DQS_ENQ. While the strobe-masking circuit 200 of an embodiment uses the AND gate 270, alternative embodiments can use any combination of logic circuits to generate the masked strobe signal DQS_Q.

The delay circuit 250 may include any number of circuits that generate/control delay elements and/or apply delays or offsets to a received signal (e.g., EN) in order to produce a delayed signal, as described above. As one example the delay circuit 250 includes a number of delay elements that couple to receive the clock signal CLK and are slaved to a DLL. Components of the delay circuit 250 select one of the delayed signals for use in generating the delayed enable signal. The selection of a delayed clock signal, and consequently an amount of delay to be applied to the enable signal, is performed in response to information of signal parameters of the host system and/or the strobe-masking system. Examples of the signal parameters include one-way signal propagation delays, round-trip propagation delays, the intrinsic cycle-based delays of the system, the signal propagation time between components of the host system, as well as intrinsic delays of devices of the various system components and circuits, to name a few.

The signal parameter information of the host system is determined during a calibration or initialization process for example, and may be represented by the contents of register files or programmable registers. The register files may be components of and/or coupled to the delay circuit 250. The calibration process includes manual processes and/or automatic processes performed by error detection circuitry. The content of the register files is determined using information of the calibration or initialization process and automatically and/or manually programmed into the register files. Once programmed, the register file contents control generation of the delayed enable signal during operation of the strobe-masking system.

Generally, the calibration process characterizes two or more signal channels by comparing relative timing information of signals on the channels. As an example, the calibration process of an embodiment may compare relative timing information of each of the enable signal EN (first clock domain) and the strobe signal DQS (second clock domain). In so doing, the calibration process determines an amount of delay that is optimal for use in generating the delayed enable signal that best corresponds to a valid portion of the strobe signal DQS.

Regarding the calibration process (automatic or manual) of an embodiment, and taking a memory system as an example, a memory controller or other component of a host system places one or more components of the memory system in a calibration mode. In the calibration mode, the memory controller performs a series of dummy read operations during which a number of read operations are performed, where each read operation is performed using different ones of delayed enable signals. A dummy read is generally defined to include a process in which a memory controller or controller interface circuit performs reads of pre-specified data stored in a memory component, independent of any data needs of components of the memory system or other higher layer machine-readable code; these reads are performed at power-up, or other intervals during which the memory component is not otherwise used. Comparisons of data read during respective dummy reads allows for identification of successful read operations, and comparisons of timing information of successful read operations allows for identification of a delayed enable signal that provides the optimal timing margin. The logic values or other register values that identify the delayed clock signal providing the best timing margin are then programmed into the programmable registers for control of delayed enable signal generation.

In the embodiments in which multiple devices are coupled to receive the same master DQS receiver, either an average optimal value or discrete values may be stored in the programmable registers for control of corresponding delayed enable signal generation. The optimal or discrete values can be switched on the fly as appropriate to the pre-specified precision of the host system.

The delay circuit 250 of an embodiment also controls the respective delays or offsets generated by the delay elements within a pre-specified range in response to variations in operating and/or environmental parameters of the host system and/or strobe-masking system. The operating or process parameters include, for example, the speed of operation, but can include numerous other parameters as appropriate. The environmental parameters include, for example temperature and/or power supply voltage, but can include numerous other parameters as appropriate.

Figure 3:
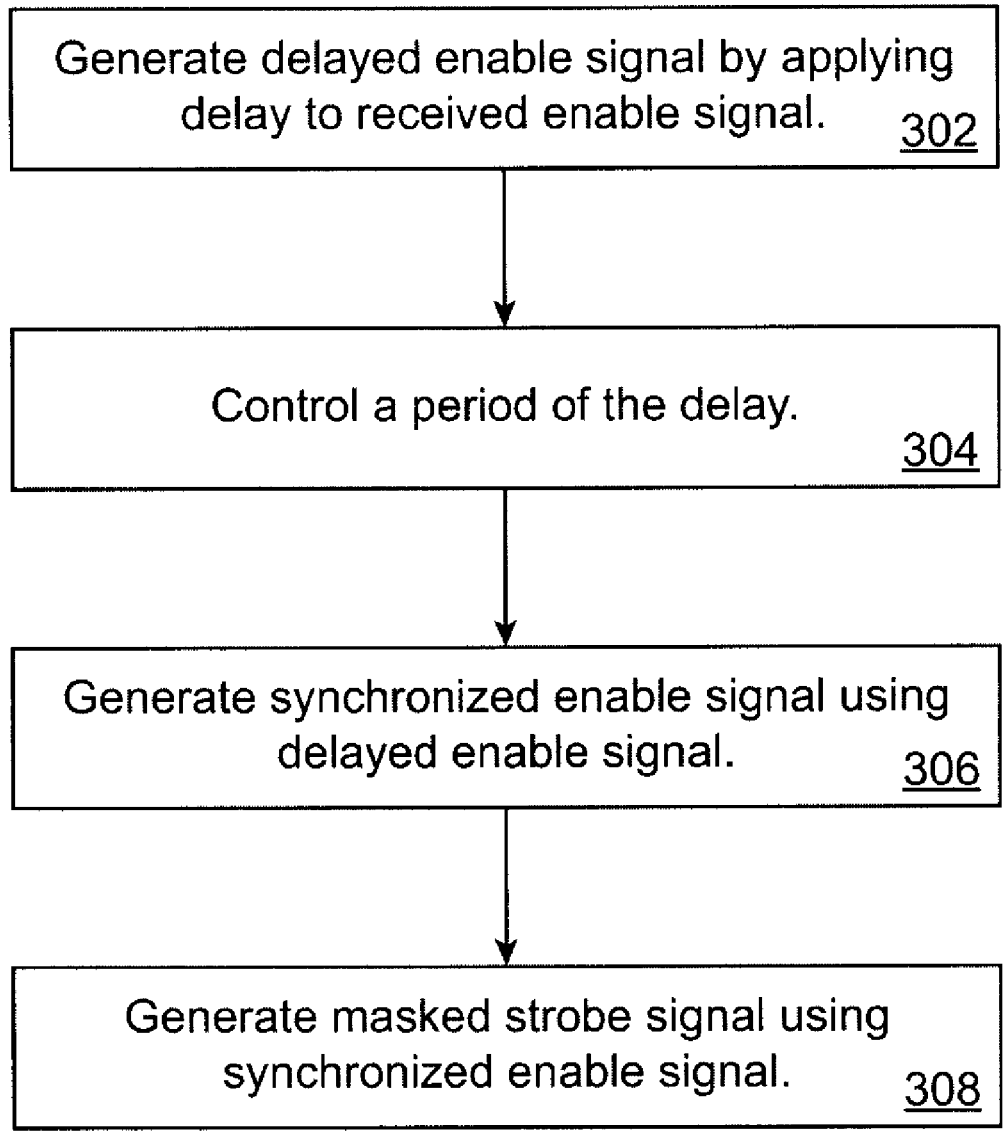
FIG. 3 is a flow diagram for masking strobe signals, under an embodiment.

FIG. 3 is a flow diagram for masking strobe signals, under an embodiment. The strobe-masking system of an embodiment generates a delayed enable signal by applying a delay to a received enable signal, at block 302. The frequency of the received enable signal corresponds to a first clock as described above. The strobe-masking system controls a period of the delay, at block 304, so as to position a transitioning edge of the delayed enable signal to coincide in time with a valid region of the strobe signal. Control of the delay of an embodiment includes determining an amount or period of delay in response to relative timing differences between the first and second clock domains and, more particularly, to relative timing differences between the enable signal and valid segments of the corresponding strobe signal. Control of the delay of an embodiment further includes compensating the delay in response to variations in one or more operating parameters of the host system and/or the strobe-masking system. The operating parameters may include at least one of process, temperature, and voltage, as well as other parameters as appropriate to the host system.

The delayed enable signal is synchronized to a valid period of a received strobe signal, at block 306, resulting in generation of a synchronized enable signal. The frequency of the strobe signal corresponds to a second clock as described above, where the second clock can operate either at the same frequency or at a different frequency than the first clock. The strobe-masking system generates a masked strobe signal from the synchronized enable signal, at block 308. Generation of the masked strobe signal includes gating the strobe signal using the synchronized enable signal, but is not so limited.

The strobe-masking system includes an adjustable or selectable delay for use in generating a delayed enable signal and a qualified or masked strobe signal, as described above. The adjustable delay facilitates reduction or elimination of the arbitrary strobe latency typical of strobe-based systems by accurately positioning or placing a transitioning edge of the delayed enable signal relative to a valid portion of the strobe signal. However, some uncertainty is inherent in the placement of the delayed enable signal relative to the strobe signal, and this uncertainty or granularity is referred to herein as "placement granularity".

Using the strobe-masking system as an example, the adjustable delay places an active region edge-transition of the delayed enable signal relative to a pre-specified segment of the strobe signal. The placement granularity in the CDC affects the accuracy of the signal placement because, when considered together with the size of the pre-specified segment, the placement granularity determines the amount of timing margin or slack (referred to herein as "CDC margin") remaining to accommodate other timing variations of the system signal channels. As frequencies of operation increase, more timing margin is needed in the CDC because the various other timing variations of the channel consume larger portions of the timing margin. The use of delay elements having finer grain resolution (e.g., 0.25 cycle, 0.125 cycle, or 0.0625 cycle) to form the adjustable delay of an embodiment therefore reduces the magnitude of the placement granularity and increases the CDC margins, as described in the two examples below.

Figure 4:
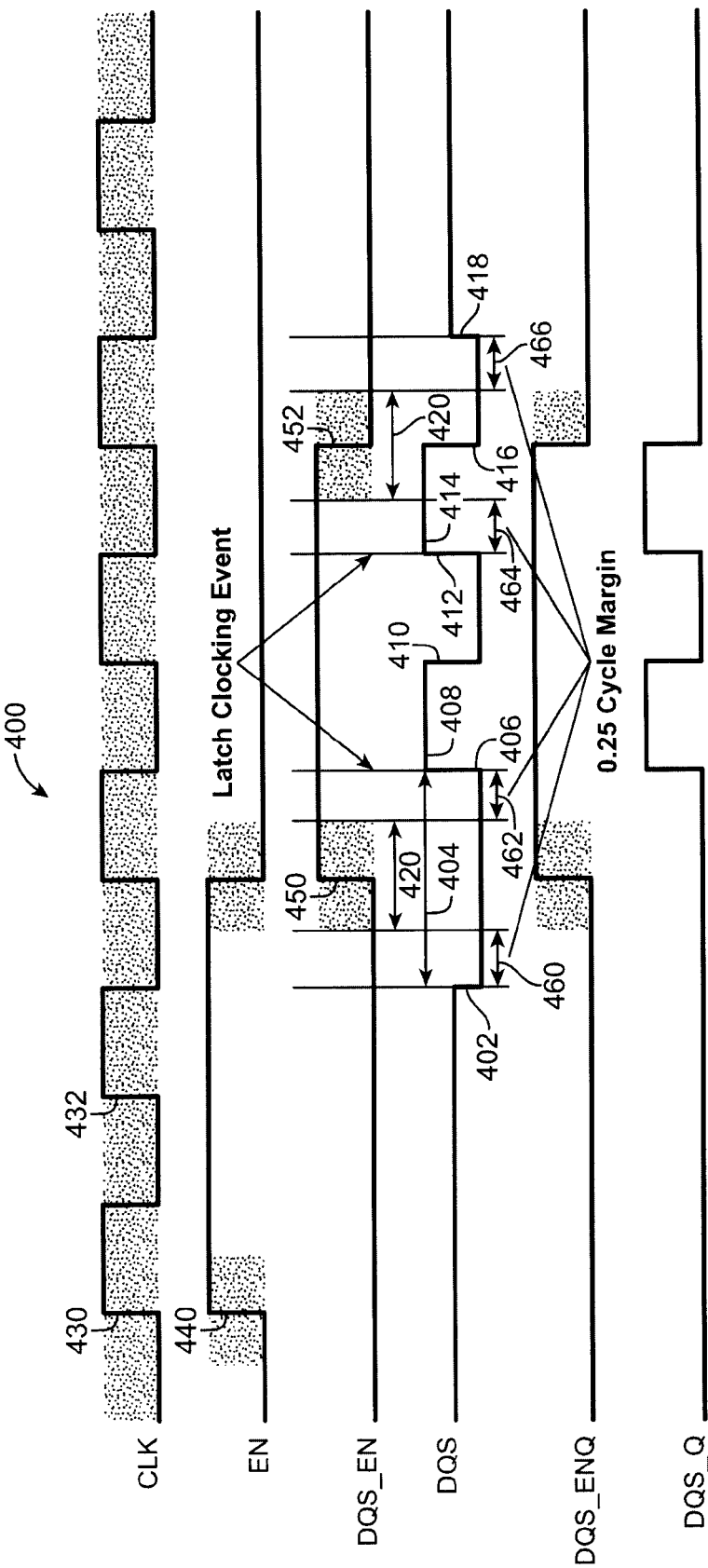
FIG. 4 is a timing diagram showing signals of a host system including a strobe-masking system with an adjustable delay having one-half cycle placement granularity, under an embodiment.

In a first example, the strobe-masking system may include an adjustable delay with a placement granularity of approximately one-half (0.5) cycle (i.e., 180 degrees) of the clock signal. FIG. 4 is a timing diagram 400 showing signals of a host system including a strobe-masking system with an adjustable delay having one-half cycle placement granularity 420, under an embodiment. As described above with reference to FIG. 1, the signals include a clock signal CLK, enable signal EN, delayed enable signal DQS_EN, strobe signal DQS, synchronized enable signal DQS_ENQ, and masked or qualified strobe signal DQS_Q. The clock signal and the enable signal EN originate under the same clock domain, so these signals are relatively edge-aligned (edge-transitions 430 and 440). However, the strobe signal DQS originates under a different clock domain and thus has no pre-specified alignment relative to the clock or enable EN signals. This example assumes the strobe signal DQS is one-half cycle out of alignment relative to a rising edge transition 432 of the clock signal, but the signal relationships are not so limited.

The strobe signal DQS includes a valid region during which data of a corresponding data signal (not shown) is valid. The valid region of the strobe signal DQS includes a preamble region 404 (approximately one clock cycle in length as defined by edge-transitions 402 and 406), a first valid signal 408 (defined by edge-transitions 406 and 410), a second valid signal 414 (defined by edge-transitions 412 and 416), and a post-amble region (approximately one-half clock cycle in length as defined by edge-transitions 416 and 418), but various alternative embodiment can accommodate strobe signals having different structures.

The strobe-masking system determines an appropriate delay to be applied to the enable signal EN during a calibration process in response to the relative timing differences between the enable signal EN and the strobe signal DQS. The amount of delay appropriate under this embodiment positions the active portion of the enable signal EN approximately coincidental with the valid region of the strobe signal DQS. For example, the first edge-transition 402 of the strobe signal valid region is offset approximately one and one-half (1.5) cycles relative to a rising edge transition 440 of the enable signal EN. Therefore, accounting for the duration of the pre-amble region 404, the strobe-masking system generates the delayed enable signal DQS_EN by delaying the enable signal EN approximately two clock cycles (1.5 cycle alignment difference+0.5 cycle (for approximate placement in the middle of the preamble region 404)=2 cycle delay).

Considering the approximately one-half cycle placement granularity 420 associated with the delayed enable signal DQS_EN of this example, the rising-edge transition 450 of the delayed enable signal DQS_EN is positioned to coincide in time with the preamble region 404 of the strobe signal DQS. This positioning of the delayed enable signal DQS_EN relative to the strobe signal DQS provides a total timing margin of one-half cycle relative to the edge-transitions 402/406 that define the preamble region 404. While the total timing margin may be distributed in numerous different proportions across the preamble region 404, the one-half cycle timing margin of this example provides a maximum one-quarter (0.25) cycle margin 460/462 between the delayed enable signal DQS_EN rising-edge transition 450 relative to any edge-transition 402/406 of the strobe signal preamble region 404.

Assuming an active period of two clock cycles for the delayed enable signal DQS_EN, and again considering the placement granularity 402, the falling-edge transition 452 of the delayed enable signal DQS_EN is positioned within one-quarter cycle of the falling-edge transition 416 of the second valid signal 414 of the strobe signal DQS. This positioning of the delayed enable signal DQS_EN relative to the strobe signal DQS provides a total timing margin of one-half cycle relative to both the rising edge-transition 412 of the second valid signal and the rising edge-transition 418 that defines the end of the strobe signal valid region (end of the post-amble region). While the timing margin may be distributed in numerous different proportions, the one-half cycle timing margin of this example provides a maximum one-quarter cycle margin 464/466 between the delayed enable signal DQS_EN falling-edge transition 452 and both of the rising edge-transition 412 of the second valid signal 414 and the edge-transition 418 defining termination of the strobe signal valid region.

The total timing margin resulting from use of delay elements with one-half cycle placement granularity of this example ensures the relative alignment of the active portion of the delayed enable signal DQS_EN and the strobe signal valid region while accommodating other perturbations in system signal timing that may affect the relative position of these signals. Latching of the delayed enable signal DQS_EN into the clock domain of the strobe signal DQS, and gating of the strobe signal DQS using this latched signal DQS_ENQ, produces a masked strobe signal DQS_Q having little or none of the arbitrary latency of the asynchronous strobe signal DQS.

Figure 5:
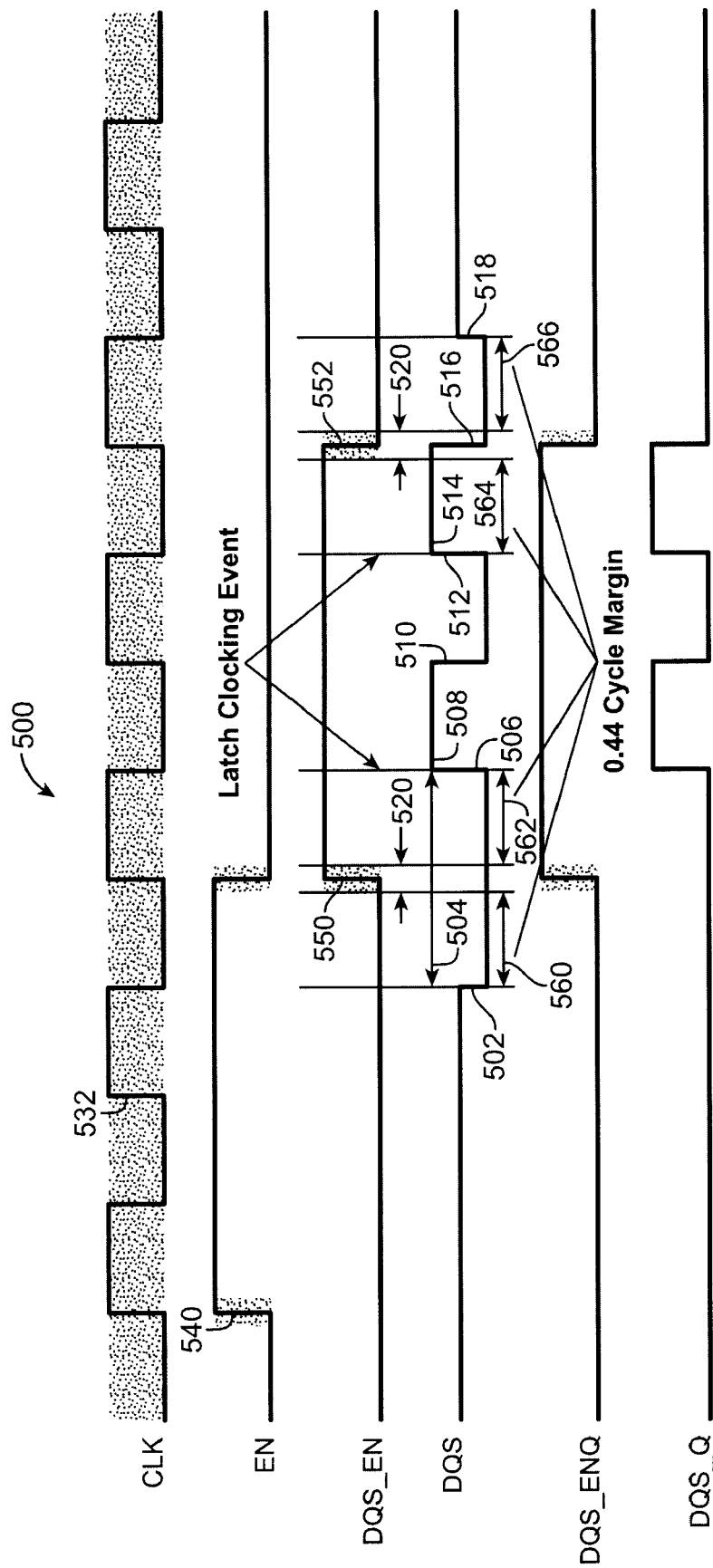
FIG. 5 is a timing diagram showing signals of a host system including a strobe-masking system with an adjustable delay having one-eighth cycle placement granularity, under an embodiment.

The strobe-masking system of an embodiment further improves or increases the timing margin through the use of an adjustable delay having a finer placement granularity. In a second example, the strobe-masking system may include an adjustable delay with a placement granularity of approximately one-eighth (0.125) cycle (i.e., 45 degrees) of the clock signal. FIG. 5 is a timing diagram 500 showing signals of a host system including a strobe-masking system with an adjustable delay having one-eighth cycle placement granularity 520, under an embodiment. This example assumes the strobe signal DQS is one-half cycle out of alignment relative to a rising edge transition 532 of the clock signal, but the signal relationships are not so limited.

The strobe signal DQS includes a valid region during which data of a corresponding data signal (not shown) is valid. The valid region of the strobe signal DQS includes a preamble region 504 (approximately one clock cycle in length as defined by edge-transitions 502 and 506), a first valid signal 508 (defined by edge-transitions 506 and 510), a second valid signal 514 (defined by edge-transitions 512 and 516), and a post-amble region (approximately one-half clock cycle in length as defined by edge-transitions 516 and 518), but various alternative embodiment can accommodate strobe signals having different structures.

The strobe-masking system determines an appropriate delay to be applied to the enable signal EN during a calibration process in response to the relative timing differences between the enable signal EN and the strobe signal DQS. The amount of delay appropriate under this embodiment positions the active portion of the enable signal EN approximately coincidental with the valid region of the strobe signal DQS. For example, the first edge-transition 502 of the strobe signal valid region is offset approximately one and one-half (1.5) cycles relative to a rising edge transition 540 of the enable signal EN. Therefore, accounting for the duration of the preamble region 504, the strobe-masking system generates the delayed enable signal DQS_EN by delaying the enable signal EN approximately two clock cycles (1.5 cycle alignment difference+0.5 cycle (for approximate placement in the middle of the preamble region 504)=2 cycle delay).

Considering the approximately one-eighth cycle placement granularity 520 associated with the delayed enable signal DQS_EN of this example, the rising-edge transition 550 of the delayed enable signal DQS_EN is positioned to coincide in time with the preamble region 504 of the strobe signal DQS. This positioning of the delayed enable signal DQS_EN relative to the strobe signal DQS provides a seven-eighths (0.875) cycle total timing margin relative to the edge-transitions 502/506 that define the preamble region 504. While the total timing margin may be distributed in numerous different proportions across the preamble region 504, the seven-eighths cycle timing margin of this example provides a maximum margin 560/562 of approximately seven-sixteenths (0.44) cycle between the delayed enable signal DQS_EN rising-edge transition 550 relative to any edge-transition 502/506 of the strobe signal preamble region 504.

Assuming an active period of two clock cycles for the delayed enable signal DQS_EN, and again considering the placement granularity 502, the falling-edge transition 552 of the delayed enable signal DQS_EN is positioned within one-sixteenth cycle of the falling-edge transition 516 of the second valid signal 514 of the strobe signal DQS. This positioning of the delayed enable signal DQS_EN relative to the strobe signal DQS provides a total timing margin of seven-eighths cycle relative to both the rising edge-transition 512 of the second valid signal and the rising edge-transition 518 that defines the end of the strobe signal valid region (end of the post-amble region). While the timing margin may be distributed in numerous different proportions, the seven-eighths cycle timing margin of this example provides a maximum margin 564/566 of approximately seven-sixteenths cycle between the delayed enable signal DQS_EN falling-edge transition 552 and both of the rising edge-transition 512 of the second valid signal 514 and the edge-transition 518 defining termination of the strobe signal valid region.

The total timing margin resulting from use of delay elements with one-eighth cycle placement granularity of this example ensures the relative alignment of the active portion of the delayed enable signal DQS_EN and the strobe signal valid region while accommodating other perturbations in system signal timing that may affect the relative position of these signals. Latching of the delayed enable signal DQS_EN into the clock domain of the strobe signal DQS, and gating of the strobe signal DQS using this latched signal DQS_ENQ, produces a masked strobe signal DQS_Q having little or none of the arbitrary latency of the asynchronous strobe signal DQS.

Figure 6:
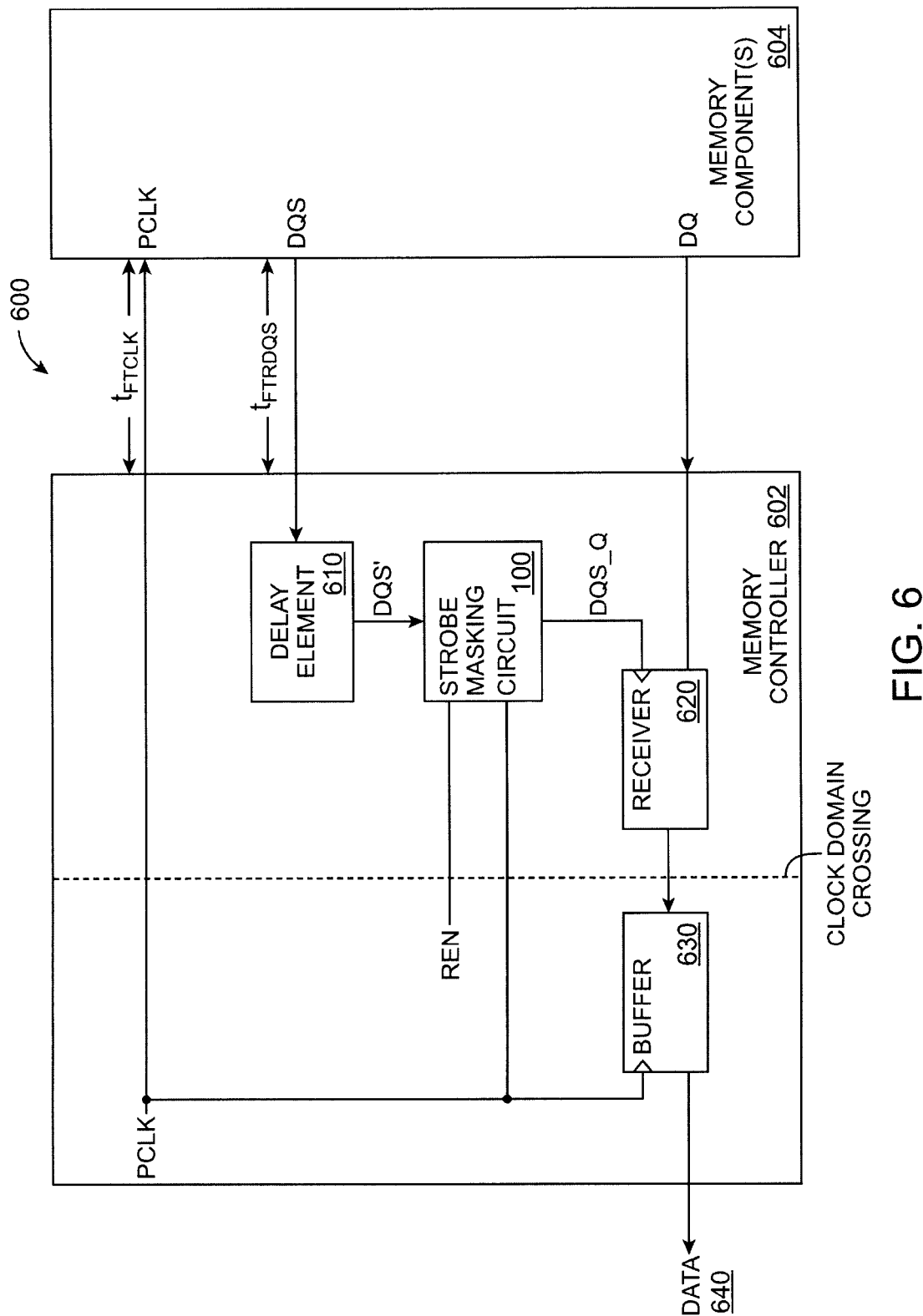
FIG. 6 is a block diagram of a memory system that includes a strobe-masking circuit, under an embodiment.

As one example of a system that includes the strobe-masking system, FIG. 6 is a block diagram of a memory system 600 that includes a strobe-masking circuit 100, under an embodiment. This memory system 600 includes a memory controller 602 coupled to one or more memory components 604; while one memory component is shown the embodiment is not limited to any particular number of memory components. The memory controller 602 can be a discrete IC device (e.g., a chipset) or can be integrated with a central processor or microprocessor IC, but is not so limited. The memory controller 602 operates in one clock domain, while the memory component 604 operates in a different clock domain. While components of the memory system 600 are described below with reference to read operations, the memory system 600 is not so limited as it operates in a number of modes including calibrate, transmit or write, and/or receive or read modes.

Components of the memory controller used for read operations with the memory component include a strobe masking circuit 100, one or more delay elements 610, a receiver or input sampler 620, and a buffer 630. The memory controller 602 couples a system clock signal PCLK to the memory component 604. The signal propagation time of the system clock signal PCLK between the memory controller 602 and the memory component 604 is "$t_{FTCLK}$". The delay element 610 couples to receive a strobe signal DQS from the memory component 604, and the propagation time of the strobe signal DQS from the memory component 604 to the memory controller 602 is referred to as "$t_{FTRDQS}$". The delay element 610 applies a delay to the strobe signal DQS (as appropriate to relative timing differences of a corresponding data signal DQ) and outputs a delayed version of the strobe signal DQS'. The delayed strobe signal DQS' couples to the strobe-masking circuit 100.

The strobe masking circuit 100, using information of a read enable signal REN, operates as described above to generate a masked strobe signal DQS-Q for use in transferring data across the clock domain crossing. The masked strobe signal DQS_Q couples to the receiver 620 along with a data signal DQ from the memory component 604. The data signal DQ of an embodiment may couple to the receiver 620 through at least one data delay element (not shown) but is not so limited. The receiver 620 samples the data signal DQ under control of the masked strobe signal DQS_Q, and transfers or couples the sampled data across the clock domain crossing to the buffer 630. The buffer 630 provides the received data as output 640 to a requesting device (not shown).

Figure 7:
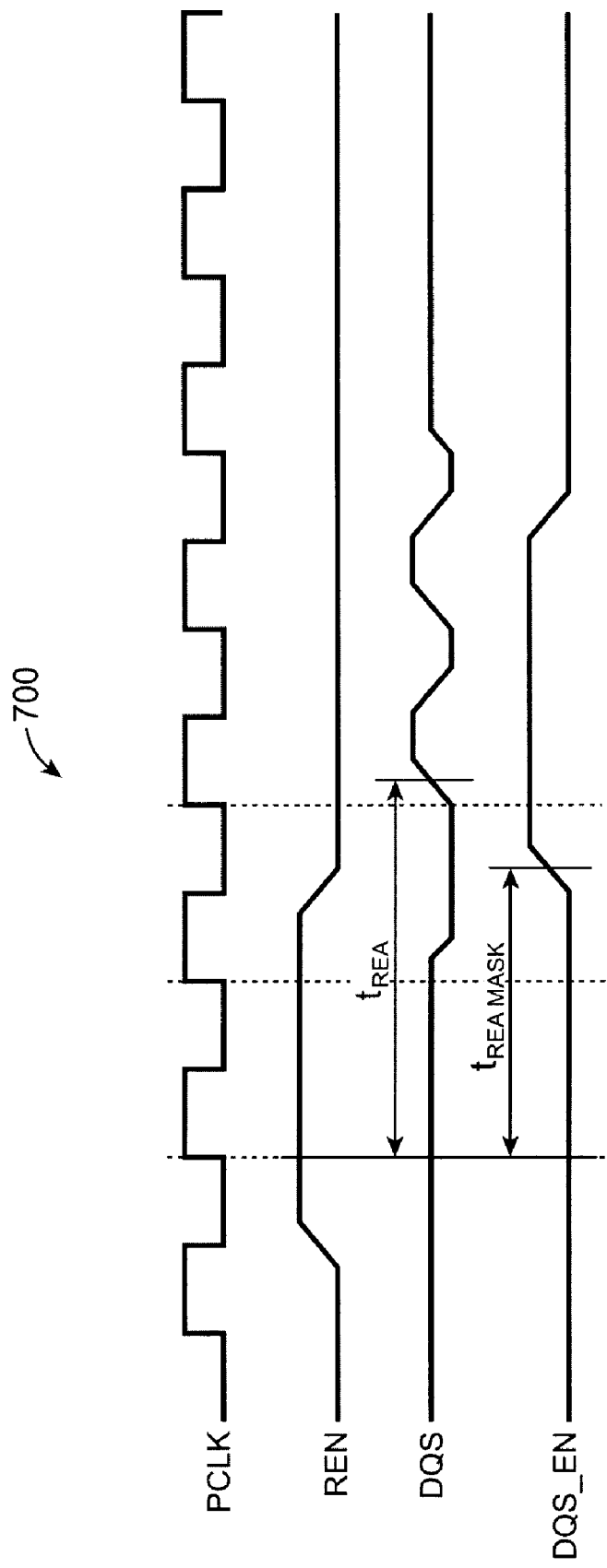
FIG. 7 is a timing diagram showing signals of the memory system including a strobe-masking system along with corresponding signal timing parameters, under an embodiment.

Using this memory system 600 as an example, and with further reference to FIGS. 4 and 5, parameters can be developed that specify timing relationships between the system clock signal, the strobe signal DQS, and the delayed enable signal DQS_EN generated by the strobe-masking circuit. FIG. 7 is a timing diagram 700 showing signals of the memory system including a strobe-masking system along with corresponding signal timing parameters, under an embodiment. The signals include the system clock signal PCLK, enable (read-enable) signal REN, strobe signal DQS, and delayed enable signal DQS_EN. The strobe masking circuit generates the delayed enable signal DQS_EN as described above and, in response to an edge transition of the strobe signal DQS that indicates the start of a valid region of the strobe signal DQS, latches the delayed enable signal DQS_EN into the clock domain of the strobe signal DQS. The memory system of an embodiment includes a parameter referred to as "$t_{REA}$" to describe the timing relationship between the strobe signal DQS and the system clock signal PCLK as $$t_{REA} = (2.0 \cdot PCLK) + t_{FTCLK} + t_{FTRDQS}.$$

The memory system of an embodiment also includes a parameter referred to as "$t_{REA\_MASK}$" to describe the timing relationship between the delayed strobe signal DQS_EN and the system clock signal PCLK as $$t_{REA\_MASK} = (1.5 \cdot PCLK) + t_{FTCLK} + t_{FTRDQS}.$$

The components of the strobe-masking systems described above include any collection of computing components and devices operating together. The components of the strobe-masking systems can also be components or subsystems within a larger computer system or network. The strobe-masking system components can also be coupled among any number of components (not shown), for example other buses, controllers, memory devices, and data input/output (I/O) devices, in any number of combinations. Many of these system components may be soldered to a common printed circuit board (for example, a graphics card or game console device), or may be integrated in a system that includes several printed circuit boards that are coupled together in a system, for example, using connector and socket interfaces such as those employed by personal computer motherboards and dual inline memory modules ("DIMM"). In other examples, complete systems may be integrated in a single package housing a system in package ("SIP") type of approach. Integrated circuit devices may be stacked on top of one another and utilize wire bond connections to effectuate communication between chips or may be integrated on a single planar substrate within the package housing.

Further, functions of the strobe-masking system components can be distributed among any number/combination of other processor-based components. The strobe-masking systems described above include, for example, various dynamic random access memory (DRAM) systems. As examples, the DRAM memory systems can include double data rate ("DDR") systems like DDR SDRAM as well as DDR2 SDRAM and other DDR SDRAM variants, such as Graphics DDR ("GDDR") and further generations of these memory technologies, i.e., GDDR2, and GDDR3, but is not limited to these memory systems. The memory systems may include any number and/or combination of discrete components. Alternatively, the memory systems may include any number and/or combination of components implemented on a chip.

Aspects of the strobe-masking systems described herein may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the strobe-masking systems include: microcontrollers with memory (such as electronically erasable programmable read only memory (EEPROM)), embedded microprocessors, firmware, software, etc. Furthermore, aspects of the strobe-masking systems may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media). Also it includes carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, netlist generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the strobe-masking systems is not intended to be exhaustive or to limit the strobe-masking systems to the precise form disclosed. While specific embodiments of, and examples for, the strobe-masking systems are described herein for illustrative purposes, various equivalent modifications are possible within the scope of the strobe-masking systems, as those skilled in the relevant art will recognize. The teachings of the strobe-masking systems provided herein can be applied to other processing systems and methods, not only for the systems and methods described above.

The elements and acts of the various embodiments described above can be combined to provide further embodiments. These and other changes can be made to the strobe-masking systems and methods in light of the above detailed description.

In general, in the following claims, the terms used should not be construed to limit the strobe-masking systems to the specific embodiments disclosed in the specification and the claims, but should be construed to include all processing systems that operate under the claims. Accordingly, the strobe-masking systems are not limited by the disclosure, but instead the scope of the strobe-masking systems is to be determined entirely by the claims.

While certain aspects of the strobe-masking systems are presented below in certain claim forms, the inventors contemplate the various aspects of the strobe-masking systems in any number of claim forms. For example, while only one aspect of the strobe-masking systems is recited as embodied in machine-readable medium, other aspects may likewise be embodied in machine-readable medium. Accordingly, the inventors reserve the right to add additional claims after filing the application to pursue such additional claim forms for other aspects of the strobe-masking systems.

What is claimed is:

1. A method of operation within a memory controller, the method comprising:
    calibrating read operations by
        setting the memory controller in a calibration mode;
        initiating a read operation by
            transmitting a read command synchronously with a clock signal generated in the memory controller within a first clock domain, the read command to access known read data in at least one memory device;
        generating a read enable signal synchronously with the clock signal;
        applying a default delay to the read enable signal, the default delay corresponding to a default expected read data latency;
        receiving first data from the at least one memory device responsive to the read command, the data accompanied by a read strobe signal generated in a second clock domain; and
        determining a delay to be applied to the read enable signal based on the relative phase relationship between the delayed read enable signal and the read strobe signal.

2. The method according to claim 1 wherein determining a delay comprises iteratively carrying out the initiating and receiving steps with incrementally adjusted delay values different from the default delay value until the received first data matches the known data.

3. The method according to claim 2 wherein the iteratively carrying out the initiating and receiving steps with incrementally adjusted delay values continues until a range of acceptable delay values is identified.

4. The method according to claim 1 and further comprising:
    storing the delay as an adjustment value in a register file for use during a normal operation mode.

5. The method according to claim 1 wherein the calibrating is carried out as part of an initialization process.

6. The method according to claim 1 wherein the calibrating is carried out manually.

7. The method according to claim 1 wherein the calibrating is carried out automatically.

8. The method according to claim 2 wherein the at least one memory device comprises a plurality of memory devices, and wherein the determined delays corresponding to the plurality of memory devices are averaged to generate an average delay.

9. The method according to claim 8 wherein the average delay is used as an adjustment value in a register file for use during a normal operation mode.

10. The method according to claim 2 wherein the at least one memory device comprises a plurality of memory devices, and wherein the determined delays corresponding to each of the plurality of memory devices are stored in register files as respective adjustment values for use in a normal operation mode.

11. The method according to claim 4 wherein the adjustment value is employed during the normal operation mode as an offset applied to the default delayed read enable signal.

12. The method according to claim 1 and further comprising:
    setting the memory controller in a normal operating mode;
    initiating a normal read operation; and
    applying the delay to the default delayed read enable signal.

13. A method of operation within a memory controller, the method comprising:
    placing the memory controller in a calibration mode;
    performing a series of dummy read operations, each of the read operations to perform a read of pre-specified data stored in at least one memory component, each of the read operations performed using different ones of delayed enable signals;
    comparing data from respective dummy read operations to identify successful read operations;
    comparing timing information from successful read operations to identify a suitable delayed enable signal; and
    during a normal operation mode:
        receiving a read data strobe signal;
        gating the received data strobe signal with the suitable delayed enable signal to generate a gated strobe signal; and
        sampling read data using the gated strobe signal.

14. The method according to claim 13 and further comprising:
    storing the suitable delayed enable signal as an adjustment value in a register file for use during the normal operation mode.

15. The method according to claim 13 wherein the placing the memory controller in a calibration mode is carried out as part of an initialization process.

16. The method according to claim 13 wherein the placing the memory controller in a calibration mode is carried out manually.

17. The method according to claim 13 wherein the placing the memory controller in a calibration mode is carried out automatically.

18. The method according to claim 13 wherein the at least one memory component comprises a plurality of memory devices, and wherein the suitable delayed enable signals corresponding to the plurality of memory devices are averaged to generate an average delayed enable signal.

19. The method according to claim 13 wherein the at least one memory component comprises a plurality of memory devices, and wherein the suitable delayed enable signals corresponding to each of the plurality of memory devices are stored in register files as respective adjustment values for use in the normal operation mode.

20. The method according to claim 13 wherein gating the received data strobe signal with the suitable delayed enable signal comprises:

masking the read data strobe signal with the suitable delayed enable signal.

21. A memory controller comprising:

means for placing the memory controller in a calibration mode;

means for performing a series of dummy read operations, each of the read operations to perform a read of pre-specified data stored in at least one memory component, each of the read operations performed using different ones of delayed enable signals;

means for comparing data from respective dummy read operations to identify successful read operations;

means for comparing timing information from successful read operations to identify a suitable delayed enable signal; and for a normal mode:

means for receiving a read data strobe signal;

means for gating the received data strobe signal with the suitable delayed enable signal to generate a gated strobe signal; and means for sampling read data using the gated strobe signal.

* * * * *